(12) United States Patent
Oishi

(10) Patent No.: US 11,476,240 B2
(45) Date of Patent: Oct. 18, 2022

(54) SEMICONDUCTOR DEVICE

(71) Applicant: Kioxia Corporation, Minato-ku (JP)

(72) Inventor: Mariko Oishi, Yokohama (JP)

(73) Assignee: Kioxia Corporation, Minato-ku (JP)

( * ) Notice: Subject to any disclaimer, the term of this patent is extended or adjusted under 35 U.S.C. 154(b) by 148 days.

(21) Appl. No.: 16/120,738

(22) Filed: Sep. 4, 2018

(65) Prior Publication Data

US 2019/0267364 A1    Aug. 29, 2019

(30) Foreign Application Priority Data

Feb. 28, 2018   (JP) .............................. JP2018-035714

(51) Int. Cl.
*H01L 25/18*   (2006.01)
*H01L 23/00*   (2006.01)
(Continued)

(52) U.S. Cl.
CPC .......... *H01L 25/18* (2013.01); *H01L 23/3121* (2013.01); *H01L 24/32* (2013.01); *H01L 24/33* (2013.01); *H01L 24/48* (2013.01); *H01L 24/73* (2013.01); *H01L 25/0657* (2013.01); *H01L 2224/2919* (2013.01); *H01L 2224/32145* (2013.01); *H01L 2224/32225* (2013.01); *H01L 2224/33181* (2013.01); *H01L 2224/48091* (2013.01); *H01L 2224/48106* (2013.01); *H01L 2224/48145* (2013.01); *H01L 2224/48227* (2013.01); *H01L 2224/73215* (2013.01); *H01L 2224/73265* (2013.01);
(Continued)

(58) Field of Classification Search
CPC . H01L 25/18; H01L 23/3121; H01L 25/0657; H01L 24/32; H01L 2224/48091; H01L 24/73
See application file for complete search history.

(56) References Cited

U.S. PATENT DOCUMENTS 5,903,049 A * 5/1999 Mori ..................... H01L 25/105
257/E25.023
6,657,290 B2 * 12/2003 Fukui ..................... H01L 24/33
257/E29.022
(Continued)

FOREIGN PATENT DOCUMENTS

JP    2015-176906    10/2015
TW    201535670 A    9/2015
(Continued)

*Primary Examiner* — Wael M Fahmy
*Assistant Examiner* — Quinton A Brasfield
(74) *Attorney, Agent, or Firm* — Oblon, McClelland, Maier & Neustadt, L.L.P.

(57) ABSTRACT

According to one embodiment, a semiconductor device includes a board, a first member, a first adhesive layer, a first electronic component, a second electronic component, and a resin. The board includes a first surface. The first member includes a second surface, and a third surface made of a material including a first organic material. The first adhesive layer adheres to the first surface and the second surface. The first electronic component is attached to the first surface, and embedded in the first adhesive layer. The resin in which the first member, the first adhesive layer, and the second electronic component embedded adheres to the first surface and the third surface.

14 Claims, 4 Drawing Sheets

(51) Int. Cl.
*H01L 23/31* (2006.01)
*H01L 25/065* (2006.01)

(52) U.S. Cl.
CPC .......... *H01L 2225/0651* (2013.01); *H01L 2225/06506* (2013.01); *H01L 2225/06562* (2013.01); *H01L 2225/06575* (2013.01); *H01L 2225/06582* (2013.01); *H01L 2924/0635* (2013.01); *H01L 2924/0665* (2013.01); *H01L 2924/07025* (2013.01); *H01L 2924/10253* (2013.01); *H01L 2924/1438* (2013.01); *H01L 2924/14511* (2013.01)

(56) References Cited

U.S. PATENT DOCUMENTS

| | | | |
|---|---|---|---|
| 7,148,081 B2 * | 12/2006 | Higashino | H01L 24/29 |
| | | | 257/E21.705 |
| 7,763,963 B2 * | 7/2010 | Hong | H01L 25/0652 |
| | | | 257/E25.027 |
| 7,935,572 B2 * | 5/2011 | Karnezos | H01L 23/3128 |
| | | | 438/108 |
| 8,309,397 B2 * | 11/2012 | Shim | H01L 25/0655 |
| | | | 257/730 |
| 8,357,563 B2 | 1/2013 | Chin et al. | |
| 9,087,710 B2 * | 7/2015 | Usami | H01L 23/552 |
| 2006/0231939 A1 * | 10/2006 | Kawabata | H01L 23/5385 |
| | | | 257/E25.023 |
| 2009/0298228 A1 * | 12/2009 | Sato | H01L 25/0657 |
| | | | 257/E21.503 |
| 2016/0148918 A1 * | 5/2016 | Ye | H01L 23/3128 |
| | | | 438/107 |
| 2016/0276312 A1 | 9/2016 | Shimizu et al. | |
| 2016/0365336 A1 * | 12/2016 | Tsukiyama | H01L 23/5384 |
| 2017/0077390 A1 * | 3/2017 | Otsuka | H01L 23/552 |

FOREIGN PATENT DOCUMENTS

| | | |
|---|---|---|
| TW | 201304018 A1 | 1/2016 |
| TW | 201613004 A | 4/2016 |
| TW | 201613050 A | 4/2016 |
| TW | 201711170 A | 3/2017 |

\* cited by examiner

SEMICONDUCTOR DEVICE

CROSS-REFERENCE TO RELATED APPLICATIONS

This application is based upon and claims the benefit of priority from Japanese Patent Application No. 2018-035714, filed on Feb. 28, 2018; the entire contents of which are incorporated herein by reference.

FIELD

Embodiments described herein relate generally to a semiconductor device.

BACKGROUND

As a semiconductor device, a device is known that includes electronic components stacked one on the other. For example, a structure called "Film On Die (FOD)" includes memories mutually stacked and a controller embedded in an adhesive layer, such as a Die Attach Film (DAF).

In the above FOD, the controller is embedded in the DAF for attaching the memories to a wiring board. However, where the memories are relatively small with respect to the controller, the DAF also becomes smaller, and thus the embedded state of the controller in the DAF may become insufficient.

DETAILED DESCRIPTION

In general, according to one embodiment, a semiconductor device includes a board, a first member, a first adhesive layer, a first electronic component, a second electronic component, and a resin. The board includes a first surface. The first member includes a second surface facing the first surface, and a third surface positioned on an opposite side to the second surface and made of a material including a first organic material. The first adhesive layer is positioned between the first surface and the second surface and adheres to the first surface and the second surface. The first electronic component is positioned between the first surface and the second surface, attached to the first surface, and embedded in the first adhesive layer. The second electronic component is attached to the third surface. The resin in which the first member, the first adhesive layer, and the second electronic component embedded adheres to the first surface and the third surface.

First Embodiment

Hereinafter, a first embodiment will be described with reference to FIGS. 1 to 3. It should be noted that, in this specification, there is a case where a plurality of representations are mentioned in terms of a constituent element according to this embodiment and description on the element. Such a constituent element and its description, which are accompanied by a plurality of representations, may be expressed by another representation unmentioned here. Further, a constituent element and its description, which are unaccompanied by a plurality of representations, also may be expressed by another representation unmentioned here.

Figure 1:
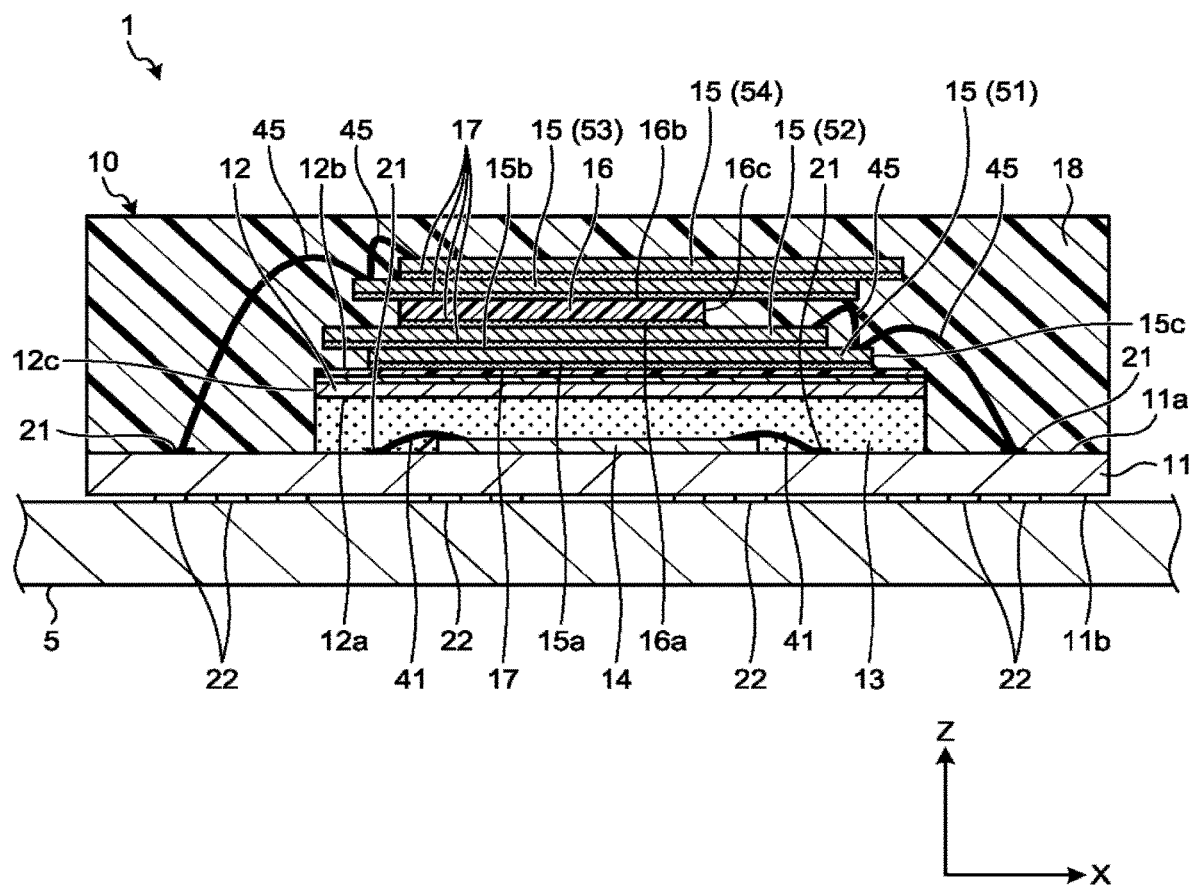
FIG. 1 is an exemplary sectional view schematically illustrating a part of an electronic apparatus according to a first embodiment.

FIG. 1 is an exemplary sectional view schematically illustrating part of an electronic apparatus 1 according to the first embodiment. The electronic apparatus 1 illustrated as an example in this embodiment is a smart phone. The electronic apparatus 1 may be, for example, a personal computer, portable computer, tablet, cellular phone, television receiver, Hard Disk Drive (HDD), Solid State Drive (SSD), USB flash drive, SD card, eMMC (registered trademark), Universal Flash Storage (UFS), memory card, another storage device, wearable device, smart speaker, home electrical appliance, or another apparatus.

As illustrating in FIG. 1, the electronic apparatus 1 includes a circuit board 5 and a semiconductor device 10. The circuit board 5 is a printed circuit board (PCB), for example. The semiconductor device 10 is mounted on the circuit board 5. Further, another device, such as a central processing unit (CPU) for controlling the electronic apparatus 1, may be mounted on the circuit board 5.

The semiconductor device 10 illustrated as an example in this embodiment is a semiconductor package of Land Grid Array (LGA) having a Film On Die (FOD) structure. Here, the semiconductor device 10 may have another structure, or may be a semiconductor package of another standard, such as Ball Grid Array (BGA).

As illustrated in drawings, in this specification, an X-axis, a Y-axis, and a Z-axis are defined. The X-axis, the Y-axis, and the Z-axis are set perpendicular to each other. The X-axis lies along the width of the semiconductor device 10. The Y-axis lies along the length (depth) of the semiconductor device 10. The Z-axis lies along the height (thickness) of the semiconductor device 10.

The semiconductor device 10 includes a board 11, a plate member 12, a first adhesive layer 13, a controller 14, a plurality of flash memories 15, a plurality of second adhesive layers 17, a spacer 16, and a sealing resin 18. The semiconductor device 10 may further include another component, such as a temperature sensor.

The plate member 12 is an example of a first member. The controller 14 is an example of a first electronic component. The plurality of flash memories 15 are an example of a second electronic component. The flash memory 15 is an example of third electronic components. Each of the controller 14 and the flash memories 15 may also be called "semiconductor chip", for example. The spacer 16 is an example of a second member. The sealing resin 18 is an example of a resin.

The board 11 is a printed wiring board (PWB), for example. The board 11 includes an upper surface 11a and a lower surface 11b. The upper surface 11a is an example of a first surface. The upper surface 11a is a substantially flat surface oriented in the positive direction of the Z-axis (the direction indicated by the arrow of the Z-axis). The lower surface 11b is a substantially flat surface positioned on the opposite side to the upper surface 11a and oriented in the negative direction of the Z-axis (the direction opposite to the arrow of the Z-axis).

The upper surface 11a of the board 11 is provided with a plurality of pads 21. Each pad 21 may also be called "land", for example. The part of the upper surface 11a other than the pads 21 is made of a solder resist, for example. On the other hand, the lower surface 11b of the board 11 is provided with a plurality of lands 22. The part of the lower surface 11b other than the lands 22 is made of a solder resist, for example.

The plurality of pads 21 and the plurality of lands 22 are electrically connected to each other through, for example, vias and wirings provided in/on the board 11. Here, at least one of the pads 21 may be electrically connected to another one of the pads 21 and electrically isolated from the lands 22. The lands 22 are electrically connected to lands provided on the circuit board 5 through solder, for example. In this way, the semiconductor device 10 is mounted on the circuit board 5.

The plate member 12 includes a lower surface 12a, an upper surface 12b, and a lateral surface 12c. The lower surface 12a is an example of a second surface. The upper surface 12b is an example of a third surface. The lateral surface 12c is an example of a fourth surface. It is noted that, in this specification, the adjectives "upper", "lower", and "lateral" or "side" are added for the sake of explanation, on the basis of FIG. 1; however, these adjectives do not limit the orientation and shape of the semiconductor device 10 or plate member 12.

The lower surface 12a is a substantially flat surface oriented in the negative direction of the Z-axis. The lower surface 12a is at a position distant from the board 11 in the positive direction of the Z-axis, and faces the upper surface 11a of the board 11. The upper surface 12b is a substantially flat surface positioned on the opposite side to the lower surface 12a and oriented in the positive direction of the Z-axis. The lateral surface 12c is positioned between the lower surface 12a and the upper surface 12b, and is oriented in a direction intersecting with the Z-axis.

Figure 2:
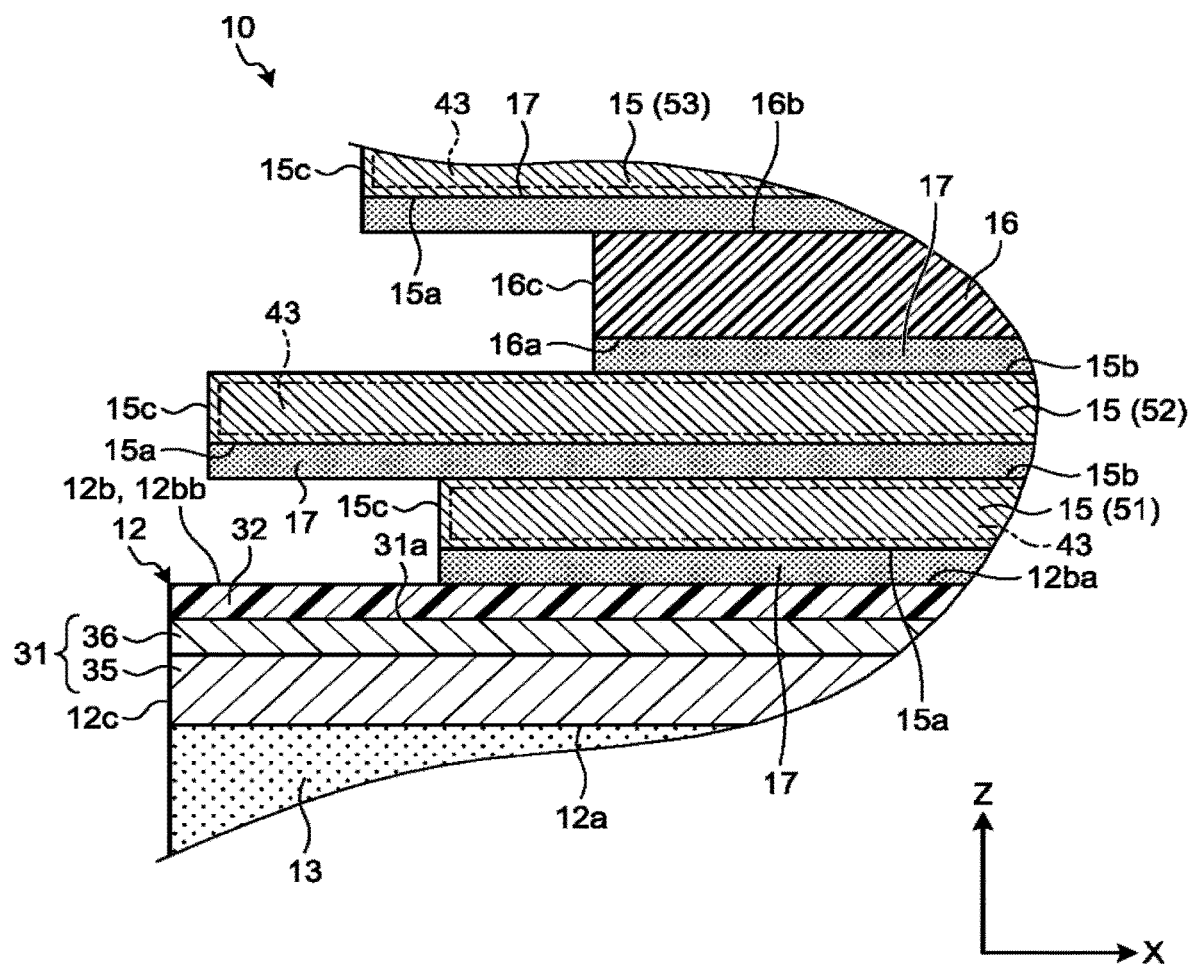
FIG. 2 is an exemplary sectional view illustrating a part of a semiconductor device according to the first embodiment.

FIG. 2 is an exemplary sectional view illustrating part of the semiconductor device 10 according to the first embodiment. Here, in FIG. 2, the sealing resin 18 is omitted. As illustrated in FIG. 2, the plate member 12 includes a substrate 31 and an organic layer 32.

The substrate 31 is in the form of a plate. Here, the substrate 31 is not limited to this example. The substrate 31 includes the lower surface 12a and a part of the lateral surface 12c, of the plate member 12. Further, the substrate 31 includes a coated surface 31a. The coated surface 31a is a substantially flat surface positioned on the opposite side to the lower surface 12a and oriented in the positive direction of the Z-axis.

The substrate 31 includes an inorganic layer 35 and an intermediate layer 36. The inorganic layer 35 is an example of an inorganic member. The inorganic layer 35 and the intermediate layer 36 have been prepared integrally. However, the inorganic layer 35 and the intermediate layer 36 may have been prepared separately.

The inorganic layer 35 is made of a material including silicon (Si) to be used for semiconductor manufacturing, for example. This silicon is an example of an inorganic material. Here, the inorganic layer 35 may be made of another material. Further, the inorganic layer 35 may contain an organic substance mixed therein. The inorganic layer 35 includes the lower surface 12a and a part of the lateral surface 12c, of the plate member 12.

The intermediate layer 36 is made of a material including silicon nitride ($Si_3N_4$), for example. The intermediate layer 36 has been generated by nitriding a part of the inorganic layer 35, for example. Thus, the intermediate layer 36 is made of a material including nitride of silicon that is used as the material of the inorganic layer 35. Here, the intermediate layer 36 is not limited to this example, but may be made of silicon dioxide (silica or $SiO_2$), which is oxide of silicon, or another material. The intermediate layer 36 includes the coated surface 31a of the substrate 31 and a part of the lateral surface 12c of the plate member 12.

The organic layer 32 is made of a material including polyimide (PI) resin, for example. This polyimide resin is an example of a first organic material. Here, the organic layer 32 may be made of a material including, for example, phenol resin, epoxy resin, or another organic material. Further, the organic layer 32 may contain an inorganic substance mixed therein.

The organic layer 32 has been applied to the coated surface 31a of the substrate 31. In other words, the organic layer 32 adheres to the intermediate layer 36 including the coated surface 31a. Accordingly, the intermediate layer 36 is positioned between the inorganic layer 35 and the organic layer 32. The organic layer 32 includes the upper surface 12b and a part of the lateral surface 12c, of the plate member 12. Thus, the upper surface 12b of the plate member 12 is made of a material including polyimide resin.

The organic layer 32 adheres to the intermediate layer 36 more firmly as compared with the case directly adhering to the inorganic layer 35. For example, the tensile strength of the connecting (adhering) portion between the organic layer 32 and the intermediate layer 36 is larger than the tensile strength of the connecting (adhering) portion between the organic layer 32 and the inorganic layer 35, which could be obtained in the case where the organic layer 32 adheres to the inorganic layer 35. Thus, the organic layer 32 adhering to the intermediate layer 36 is less likely to peel as compared with the case adhering to the inorganic layer 35.

The first adhesive layer 13 is a Die Attach Film (DAF), and is made of a material including acrylic polymer and epoxy resin, for example. The Die Attach Film may also be called "Die Bonding Film".

As illustrated in FIG. 1, the first adhesive layer 13 is arranged between the upper surface 11a of the board 11 and the lower surface 12a of the plate member 12. The first adhesive layer 13 adheres to both of the upper surface 11a and the lower surface 12a to fix the board 11 and the plate member 12 to each other.

The controller 14 is configured to control storing and reading of the plurality of flash memories 15, for example. Here, in addition to the flash memories 15, the controller 14 may be configured to control another electronic component included in the semiconductor device 10.

The controller 14 is positioned between the upper surface 11a of the board 11 and the lower surface 12a of the plate member 12. In this way, the plate member 12 is placed over the controller 14 through the first adhesive layer 13 in the Z-axis direction. In other words, the plate member 12 and the controller 14 are arranged in the Z-axis direction, and the first adhesive layer 13 is intermediate between the plate member 12 and the controller 14.

The controller 14 is attached to the upper surface 11a, and is electrically connected to a plurality of pads 21 on the upper surface 11a by a plurality of first bonding wires 41. Accordingly, the controller 14 has been electrically connected to wirings provided in/on the board 11, by wire bonding. Here, the controller 14 is not limited to this example, but may be mounted on the upper surface 11a by using another method, such as flip-chip mounting, for example.

The controller 14 including the first bonding wires 41 is embedded in the first adhesive layer 13. Specifically, while the controller 14 is mounted on the upper surface 11a, the controller 14 is surrounded by the first adhesive layer 13, and is covered with the first adhesive layer 13. In other words, the controller 14 is accommodated in the first adhesive layer 13, and is in the first adhesive layer 13.

In the Z-axis direction, the length (thickness) of the first adhesive layer 13 is larger than the length (thickness) of the controller 14. Further, in a direction (for example, the X-axis direction) intersecting with the Z-axis, the length (width) of the first adhesive layer 13 is larger than the length (width) of the controller 14.

Each flash memory 15 is a NAND type flash memory. Here, the flash memory 15 is not limited to this example. The flash memory 15 includes a silicon substrate (silicon wafer) 43, which serves as a layer made of a material including silicon. Thus, the material of each flash memory 15 and the material of inorganic layer 35 both include silicon.

As illustrated in FIG. 2, each of the plurality of flash memories 15 includes a lower surface 15a, an upper surface 15b, and a lateral surface 15c. The upper surface 15b is an example of a surface. The lower surface 15a is a substantially flat surface oriented in the negative direction of the Z-axis. The upper surface 15b is a substantially flat surface positioned on the opposite side to the lower surface 15a and oriented in the positive direction of the Z-axis. The lateral surface 15c is positioned between the lower surface 15a and the upper surface 15b, and is oriented in a direction intersecting with the Z-axis.

The upper surface 15b of each flash memory 15 is made of a material includes polyimide resin, for example. Thus, the material of the upper surface 15b of each flash memory 15 and the material of the organic layer 32 of the plate member 12 both include polyimide resin.

As illustrating in FIG. 1, a terminal provided on the upper surface 15b of each flash memory 15 is electrically connected by a second bonding wire 45 to a terminal provided on the upper surface 15b of another flash memory 15 or a pad 21 provided on the upper surface 11a. Thus, each of the plurality of flash memories 15 is electrically connected by second bonding wires 45 to another flash memory 15 or a plurality of pads 21 provided on the upper surface 11a.

The plurality of flash memories 15 are electrically connected to the controller 14 through the second bonding wires 45, the wirings of the board 11, and the first bonding wires 41. With this arrangement, the controller 14 can control the flash memories 15.

The plurality of flash memories 15 are mutually stacked in the Z-axis direction, and are attached to the upper surface 12b of the plate member 12. As the plurality of flash memories 15 are attached to the upper surface 12b, the flash memories 15 is placed over the controller 14 in the Z-axis direction with the plate member 12 and the first adhesive layer 13 interposed therebetween. In other words, the flash memories 15 and the controller 14 are arranged in the Z-axis direction, and the plate member 12 and the first adhesive layer 13 are intermediate between the flash memories 15 and the controller 14.

The plurality of flash memories 15 include a first flash memory 51, a second flash memory 52, a third flash memory 53, and a fourth flash memory 54. Each of the first to fourth flash memories 51 to 54 includes the lower surface 15a and the upper surface 15b. In this embodiment, the first to fourth flash memories 51 to 54 are electronic components equivalent to each other; however, these flash memories 51 to 54 may be different from each other in shape and/or capacity, for example.

The first flash memory 51 is attached to the upper surface 12b of the plate member 12. The second flash memory 52 is attached to the upper surface 15b of the first flash memory 51. The third flash memory 53 is attached to the upper surface 15b of the second flash memory 52 through the spacer 16. The fourth flash memory 54 is attached to the upper surface 15b of the third flash memory 53. In this way, the second to fourth flash memories 52 to 54 are attached to the upper surface 12b of the plate member 12 through the first flash memory 51.

The spacer 16 is made of a material including polyimide resin, for example. This polyimide resin is an example of a second organic material. Here, the spacer 16 may be made of, for example, phenol resin, epoxy resin, or another material.

The spacer 16 is in the form of a plate. Here, the spacer 16 is not limited to this example. The spacer 16 includes a lower surface 16a, an upper surface 16b, and a lateral surface 16c. The lower surface 16a is an example of a fifth surface. The upper surface 16b is an example of a sixth surface. The lateral surface 16c is an example of a seventh surface.

The lower surface 16a is a substantially flat surface oriented in the negative direction of the Z-axis. The upper surface 16b is a substantially flat surface positioned on the opposite side to the lower surface 16a and oriented in the positive direction of the Z-axis. The lateral surface 16c is positioned between the lower surface 16a and the upper surface 16b, and is oriented in a direction intersecting with the Z-axis. As the spacer 16 is made of a material including polyimide resin, the lower surface 16a, the upper surface 16b, and the lateral surface 16c are made of a material including polyimide resin.

The spacer 16 is positioned between the second flash memory 52 and the third flash memory 53. The lower surface 16a faces the upper surface 15b of the second flash memory 52. The upper surface 16b faces the lower surface 15a of the third flash memory 53.

Each second adhesive layer 17 is a DAF. Here, the second adhesive layer 17 is not limited to this example. The plurality of second adhesive layers 17 adhere to the lower surfaces 15a of the flash memories 15 and the lower surface 16a of the spacer 16.

The second adhesive layer 17 adhering to the first flash memory 51 adheres to the upper surface 12b of the plate member 12. Thus, this second adhesive layer 17 attaches the first flash memory 51 to the upper surface 12b.

The second adhesive layer 17 adhering to the second flash memory 52 adheres to the upper surface 15b of the first flash memory 51. Thus, this second adhesive layer 17 attaches the second flash memory 52 to the first flash memory 51.

The second adhesive layer 17 adhering to the spacer 16 adheres to the upper surface 15b of the second flash memory 52. Thus, this second adhesive layer 17 attaches the lower surface 16a of the spacer 16 to the second flash memory 52.

The second adhesive layer 17 adhering to the third flash memory 53 adheres to the upper surface 16b of the spacer 16. Thus, this second adhesive layer 17 attaches the third flash memory 53 to the upper surface 16b of the spacer 16.

The second adhesive layer 17 adhering to the fourth flash memory 54 adheres to the upper surface 15b of the third flash memory 53. Thus, this second adhesive layer 17 attaches the fourth flash memory 54 to the third flash memory 53.

The spacer 16 may be provided not only at the position between the second flash memory 52 and the third flash memory 53, but also at the position between the first flash memory 51 and the second flash memory 52, and/or at the position between the third flash memory 53 and the fourth flash memory 54. The spacer 16 makes it possible, for example, to prevent interference between a flash memory 15 and another component, and to form a space for arranging a second bonding wire 45.

In FIG. 1, each second adhesive layer 17 is thinner than the first adhesive layer 13. However, the thickness of each second adhesive layer 17 may be equal to the thickness of the first adhesive layer 13, or may be larger than the thickness of the first adhesive layer 13.

Figure 3:
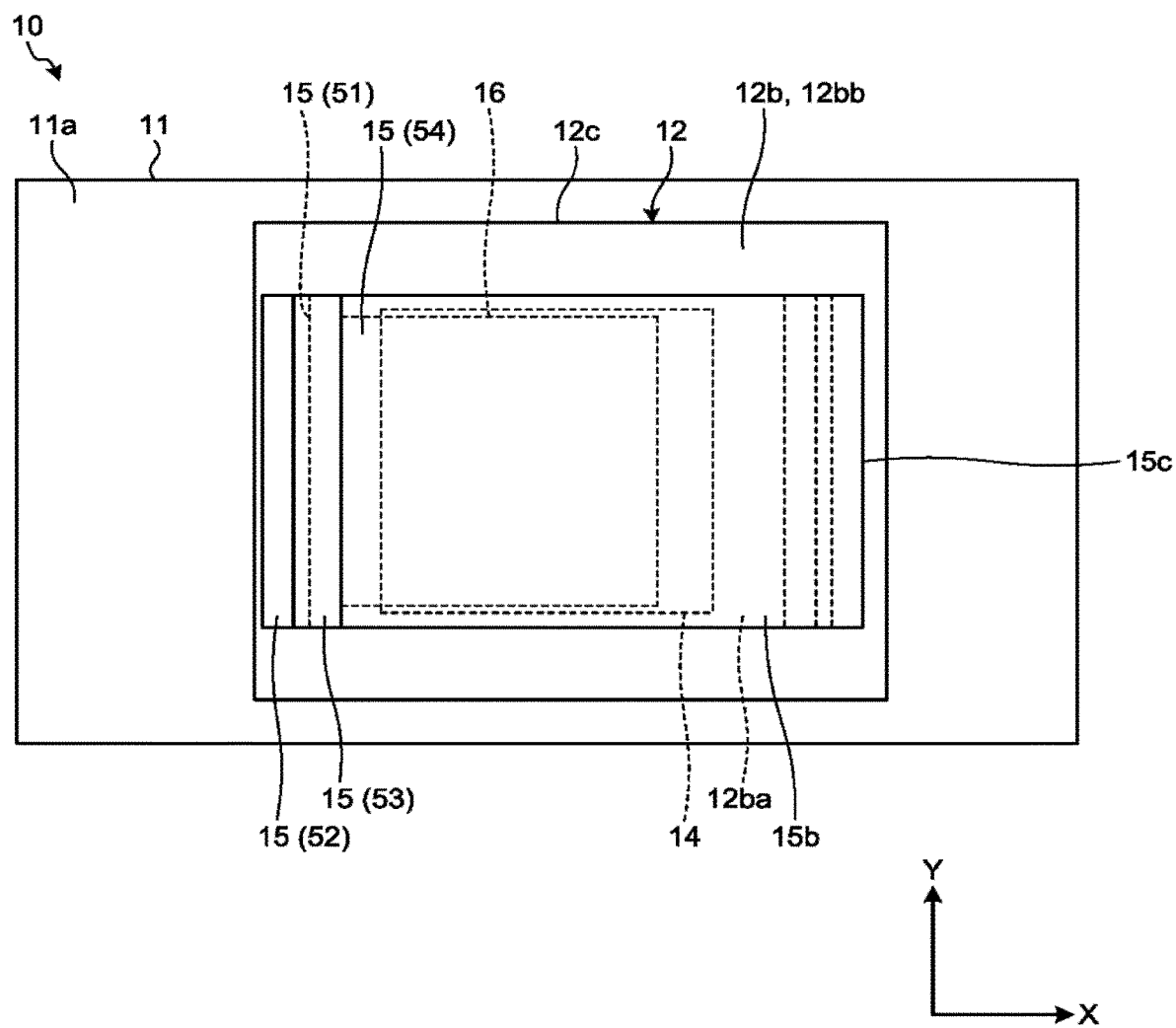
FIG. 3 is an exemplary plan view schematically illustrating the semiconductor device according to the first embodiment.

FIG. 3 is an exemplary plan view schematically illustrating the semiconductor device 10 according to the first embodiment. In FIG. 3, the sealing resin 18, the first bonding wires 41, and the second bonding wires 45 are omitted.

As illustrated in FIG. 3, in plan view looking toward the negative direction of the Z-axis, the controller 14 is smaller than the plate member 12, and is present inside the lateral surface 12c of the plate member 12. The lateral surface 12c is an example of an edge of the first member. In other words, in plan view looking toward the negative direction of the Z-axis, the controller 14 is present inside the lateral surface 12c of the plate member 12, and is distant from the lateral surface 12c. Further, in other words, the region of the controller 14 in the X-Y plane is accommodated in the region of the plate member 12 in the X-Y plane.

Further, in plan view looking toward the negative direction of the Z-axis, each of the plurality of flash memories 15 is smaller than the plate member 12, and is present inside the lateral surface 12c of the plate member 12. Here, in plan view looking toward the negative direction of the Z-axis, one or more of the flash memories 15 may be larger than the plate member 12, and/or may be present beyond the lateral surface 12c.

As described above, the first flash memory 51 is attached to the upper surface 12b of the plate member 12. The upper surface 12b includes a first portion 12ba and a second portion 12bb. The first portion 12ba is that portion of the upper surface 12b, which is provided with the first flash memory 51 attached thereto and is covered with the first flash memory 51. The second portion 12bb is the portion of the upper surface 12b other than the first portion 12ba. The area of the second portion 12bb is larger than the area of the lateral surface 12c of the plate member 12.

The sealing resin 18 illustrated in FIG. 1 is made of a material including epoxy resin with an inorganic substance, such as silicon dioxide, mixed therein, for example. Here, the sealing resin 18 may be made of a material including another synthetic resin. The sealing resin 18 seals the plate member 12, the first adhesive layer 13, the controller 14, the plurality of flash memories 15, the spacer 16, and the plurality of second adhesive layers 17, which are mounted on the board 11.

The plate member 12, the first adhesive layer 13 containing the controller 14 embedded therein, the plurality of flash memories 15, the spacer 16, and the plurality of second adhesive layers 17 are embedded in the sealing resin 18. Thus, the plate member 12, the first adhesive layer 13, the plurality of flash memories 15, the spacer 16, and the plurality of second adhesive layers 17 are surrounded by the sealing resin 18, and are covered with the sealing resin 18. In other words, the plate member 12, the first adhesive layer 13, the plurality of flash memories 15, the spacer 16, and the plurality of second adhesive layers 17 are accommodated in the sealing resin 18, and is in the sealing resin 18.

The sealing resin 18 adheres to the upper surface 11a of the board 11, the upper surface 12b and lateral surface 12c of the plate member 12, the first adhesive layer 13, the upper surfaces 15b and lateral surfaces 15c of the flash memories 15, the lateral surface 16c of the spacer 16, and the second adhesive layers 17. The sealing resin 18 adheres to the second portion 12bb of the upper surface 12b of the plate member 12. Thus, the area of that portion (second portion 12bb) of the upper surface 12b, to which the sealing resin 18 adheres, is larger than the area of that portion of the lateral surface 12c, to which the sealing resin 18 adheres.

The upper surface 11a of the board 11, the upper surface 12b of the plate member 12, the first adhesive layer 13, the upper surfaces 15b of the flash memories 15, the lateral surface 16c of the spacer 16, the second adhesive layers 17, and the sealing resin 18 are made of a material including an organic material. Since the organic resin portions adhere to each other, the sealing resin 18 adheres to the upper surface 11a of the board 11, the upper surface 12b of the plate member 12, the first adhesive layer 13, the upper surfaces 15b of the flash memories 15, the lateral surface 16c of the spacer 16, and the second adhesive layers 17, more firmly as compared to the case adhering to an inorganic material.

For example, the adhesiveness between the sealing resin 18 and the upper surface 12b of the plate member 12 is improved. Accordingly, the tensile strength of the connecting (adhering) portion between the sealing resin 18 and the upper surface 12b of the plate member 12 is larger than the tensile strength of the connecting (adhering) portion between the sealing resin 18 and the lateral surface 12c of the inorganic layer 35. Thus, the portion of the sealing resin 18 adhering to the upper surface 12b is less likely to peel as compared with the case adhering to a portion made of an inorganic material.

Hereinafter, a part of an example of a method of manufacturing the plate member 12 and the first adhesive layer 13 will be described. Here, the method of manufacturing the plate member 12 and the first adhesive layer 13 is not limited to the following method, but may be achieved by using another method.

First, a silicon wafer is manufactured by a substrate manufacturing apparatus for manufacturing the silicon substrate 43 of each flash memory 15. The silicon wafer is a silicon plate including a plurality of substrates 31 before separation (dicing). Hereinafter, for the sake of explanation, a silicon wafer before dicing also will be referred to as a substrate 31.

The substrate manufacturing apparatus may manufacture the substrate 31 from a material the same as that of the silicon substrate 43 of each flash memory 15, or may manufacture the substrate 31 from a material slightly different from that of the silicon substrate 43 of each flash memory 15. However, the material of the silicon substrate 43 of each flash memory 15 and the material of the substrate 31 both include silicon.

Then, part of the substrate 31 is nitrided by a nitriding apparatus. Consequently, the intermediate layer 36, which is a silicon nitride layer, is formed in the substrate 31. Instead, part of the substrate 31 may be oxidized by an oxidizing apparatus, such that the intermediate layer 36, which is a silicon dioxide layer, is formed in the substrate 31. Then, the organic layer 32 is applied to the coated surface 31a of the intermediate layer 36. Here, the generation of the intermediate layer 36 may be omitted, and the organic layer 32 may be applied to the inorganic layer 35.

Then, the inorganic layer 35 of the substrate 31 is shaved (grinded) by a grinder. Consequently, the thickness of the substrate 31 is adjusted. Then, the first adhesive layer 13, which is a DAF, is set to adhere to the lower surface 12a of the inorganic layer 35.

Then, the silicon wafer with the organic layer 32 and the first adhesive layer 13 adhering thereto is cut and divided (diced). Consequently, the plate member 12 and the first adhesive layer 13, which are illustrated in FIG. 1, are obtained as an integrated component.

In the semiconductor device 10 according to the first embodiment described above, the controller 14 is positioned between the upper surface 11a of the board 11 and the lower surface 12a of the plate member 12, and is embedded in the first adhesive layer 13 adhering to the upper surface 11a and the lower surface 12a. The flash memories 15 are attached to the upper surface 12b of the plate member 12. Consequently, in this FOD structure, regardless of the size and shape of each flash memory 15, it is possible to provide the first adhesive layer 13 in an amount sufficient to embed the controller 14, between the board 11 and plate member 12, and thereby to make the flash memories 15 stable.

The sealing resin 18, in which the plate member 12, the first adhesive layer 13, and the flash memories 15 are embedded, adheres to the upper surface 11a of the board 11 and the upper surface 12b of the plate member 12. The upper surface 12b is made of a material including polyimide resin, which is an organic material. Thus, as compared with the case where the upper surface 12b is made of an inorganic material, the sealing resin 18 adheres to the upper surface 12b of the plate member 12 more reliably. Consequently, for example, the sealing resin 18 is suppressed from peeling off the plate member 12, and the semiconductor device 10 is suppressed from deteriorating the yield.

In plan view looking toward the direction in which the lower surface 12a is oriented, the controller 14 is smaller than the plate member 12, and is positioned inside the lateral surface 12c of the plate member 12. Consequently, the controller 14 is embedded in the first adhesive layer 13 more reliably, and the plate member 12, and the flash memories 15 attached to this plate member 12 are made stable.

In plan view looking toward the direction in which the lower surface 12a is oriented, each flash memory 15 is smaller than the plate member 12, and is positioned inside the lateral surface 12c of the plate member 12. However, as the first adhesive layer 13 is provided on the plate member 12 larger than each flash memory 15, the controller 14 can be embedded in the first adhesive layer 13 more reliably, even though each flash memory 15 is small. Consequently, the plate member 12, and the flash memories 15 attached to this plate member 12 are made stable.

The area of that portion (second portion 12bb) of the upper surface 12b, to which the sealing resin 18 adheres, is larger than the area of that portion of the lateral surface 12c, to which the sealing resin 18 adheres. Here, the upper surface 12b with a larger area of the portion to which the sealing resin 18 adheres is made of a material including an organic material. Consequently, the sealing resin 18 can adhere to the plate member 12 more reliably.

The plate member 12 includes the inorganic layer 35 having the lower surface 12a and made of an inorganic material, such as silicon, and the organic layer 32 having the upper surface 12b and made of a material including an organic material. As part of the plate member 12 is made of an inorganic material, the rigidity of the plate member 12 can be easily set higher.

The plate member 12 includes the intermediate layer 36 positioned between the inorganic layer 35 and the organic layer 32. The tensile strength of the connecting portion between the organic layer 32 and the intermediate layer 36 is larger than the tensile strength of the connecting portion between the organic layer 32 and the inorganic layer 35, which could be obtained in the case where the organic layer 32 adheres to the inorganic layer 35. Consequently, the organic layer 32 is suppressed from peeling.

The plate member 12 includes the intermediate layer 36 positioned between the inorganic layer 35 and the organic layer 32 and made of a material including silicon nitride. Consequently, the intermediate layer 36 can be easily formed in the substrate 31 by nitriding, and the organic layer 32 is thereby suppressed from peeling.

Each flash memory 15 includes a silicon substrate 43 made of a material including silicon, which is an inorganic material. Consequently, manufacturing of the silicon substrate 43 of each flash memory 15 and manufacturing of the substrate 31 including the inorganic layer 35 can be partly commonized, and the semiconductor device 10 is thereby suppressed from increasing the cost.

The spacer 16 is provided between two flash memories 15 adjacent to each other. The sealing resin 18 adheres to the lateral surface 16c of the spacer 16. The lateral surface 16c is made of a material including polyimide resin, which is an organic material. Accordingly, as compared with the case where the lateral surface 16c is made of an inorganic material, the sealing resin 18 can adhere to the lateral surface 16c of the spacer 16 more reliably.

The upper surface 15b of each flash memory 15 is made of a material including polyimide resin. Consequently, the material of the upper surface 15b of each flash memory 15 and the material of the upper surface 12b of the plate member 12 can be commonized, and the semiconductor device 10 is thereby suppressed from increasing the cost.

Second Embodiment

Hereinafter, a second embodiment will be described with reference to FIG. 4. It should be noted that, in the following description of this embodiment, the constituent elements having functions the same as those of constituent elements previously described are denoted by reference symbols the same as those for the constituent elements previously described, and, further, their description will be omitted in some cases. Furthermore, a plurality of constituent elements denoted by the same reference symbols are not necessarily the same in all the functions and properties, but may be different in function and/or property as needed for the respective embodiments.

Figure 4:
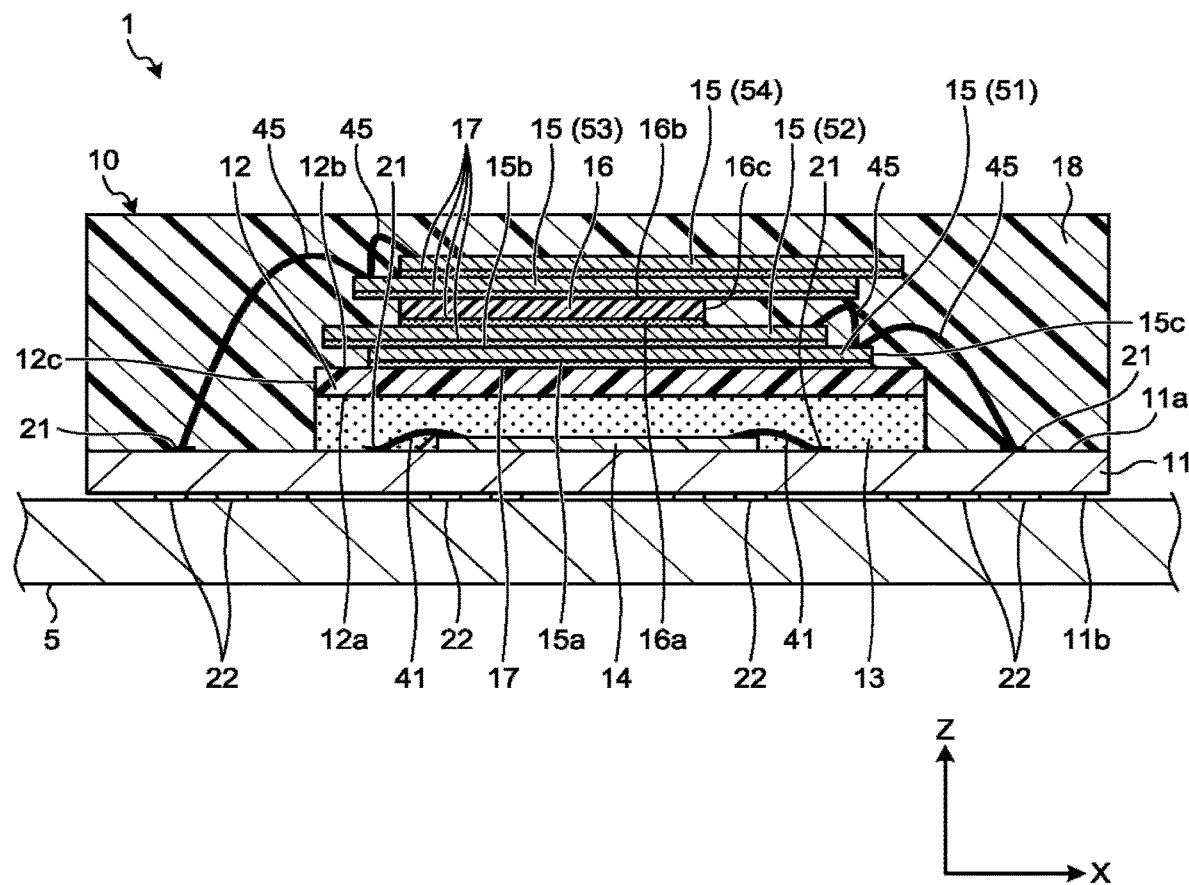
FIG. 4 is an exemplary sectional view schematically illustrating part of an electronic apparatus according to a second embodiment.

FIG. 4 is an exemplary sectional view schematically illustrating part of an electronic apparatus 1 according to the second embodiment. As illustrated in FIG. 4, a plate member 12 according to the second embodiment is made of a material including polyimide resin. Thus, the lower surface 12a, the upper surface 12b, and the lateral surface 12c are also made of a material including polyimide resin.

In the semiconductor device 10 according to the second embodiment described above, the plate member 12 is made of a material including polyimide resin. Consequently, the upper surface 12b can be easily formed by a material including polyimide resin. Further, as the lateral surface 12c is also made of a material including polyimide resin, the sealing resin 18 can adhere to the plate member 12 more reliably, and, for example, the sealing resin 18 is suppressed from peeling off the plate member 12.

Hereinafter, a modification according to first and second embodiments will be described. In this modification, the organic layer 32 of the plate member 12 or the plate member 12 is made of a material including epoxy resin. This epoxy resin is an example of the first organic material. Thus, the sealing resin 18 is made of a material including epoxy resin, which is the material of the organic layer 32.

In this modification, the organic layer 32 of the plate member 12 or the plate member 12 may be made of a material including polyimide resin, and the sealing resin 18 also may be made of a material including polyimide resin. As described above, in this modification, the material of the upper surface 12b of the plate member 12 or the plate member 12, and the material of the sealing resin 18 include a common organic material.

In this modification, the sealing resin 18 is made of a material including epoxy resin or polyimide resin, which is the same as the material of the upper surface 12b of the plate member 12 or the plate member 12.

Consequently, the sealing resin 18 can adhere to the upper surface 12b of the plate member 12 more reliably. Further, the coefficient of thermal expansion of the sealing resin 18 and the coefficient of thermal expansion of the upper surface 12b become similar to each other; this suppresses peeling due to thermal expansion and contraction.

In the plurality of embodiments described above, the controller 14 is an example of the first electronic component, and the flash memories 15 are an example of the second electronic component. However, the first electronic component and the second electronic component are not limited to these examples. For example, another electronic component, such as an interface chip, may be an example of the first electronic component. Further, a second electronic component, which includes a plurality of third components mutually stacked, is not limited to the flash memories 15, but may include a plurality of electronic components of different types.

In at least one of the embodiments described above, a first electronic component is positioned between a first surface of a board and a second surface of a first member, and is embedded in an adhesive layer adhering to the first surface and the second surface. A second electronic component is attached to a third surface of the first member. Consequently, regardless of the size of the second electronic component, it is possible to provide the adhesive layer in an amount sufficient to embed the first electronic component, between the board and the first member.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a board including a first surface;
   a first member that is a laminate including a silicon substrate and a resin layer including polyimide, the first member having a second surface facing the first surface, and the resin layer having a third surface;
   a first adhesive layer positioned between the first surface and the second surface and adhering directly to the first surface and the entire second surface;
   a first semiconductor chip positioned between the first surface and the second surface, attached to the first surface, and embedded in the first adhesive layer;
   a second semiconductor chip including an eighth surface that is a lower surface of the second semiconductor chip, the eighth surface facing the third surface;
   a second adhesive layer positioned between the third surface and the eighth surface and adhering to the third surface and the entire eighth surface;
   a resin in which the first member, the first adhesive layer, and the second semiconductor chip embedded, the resin adhering to the first surface and the third surface; and
   a first bonding wire electrically and physically connecting the second semiconductor chip to the board and embedded in the resin, wherein
   in plane view looking toward a direction in which the second surface is oriented, the first semiconductor chip is smaller than the first member and is positioned inside an edge of the first member,
   in plane view looking toward a direction in which the second surface is oriented, the second semiconductor chip is smaller than the first member and is positioned inside an edge of the first member,
   in plane view looking toward a direction in which the second surface is oriented, the second semiconductor chip is larger than the first semiconductor chip,
   the first member is not provided with any conductive pattern therein and not connected to any bonding wire, and
   in a plane view toward a direction in which the second surface is oriented, the second adhesive layer is smaller than the resin layer of the first member.

2. The semiconductor device according to claim 1, wherein
   the first member includes a fourth surface positioned between the second surface and the third surface,
   the resin adheres further to the fourth surface, and
   an area of a portion of the third surface to which the resin adheres is larger than an area of a portion of the fourth surface to which the resin adheres.

3. The semiconductor device according to claim 1, wherein
   the first member includes an intermediate layer positioned between the silicon substrate and the resin layer and positioned between the second semiconductor chip and the silicon substrate,
   the resin layer adheres to the intermediate layer, and
   a tensile strength of a connecting portion between the resin layer and the intermediate layer is larger than a tensile strength of a connecting portion between the resin layer and the silicon substrate, which is obtained in a case where the resin layer adheres to the silicon substrate.

4. The semiconductor device according to claim 1, wherein
   the first member includes an intermediate layer positioned between the silicon substrate and the resin layer and made of a material including oxide or nitride of the silicon substrate.

5. The semiconductor device according to claim 1, wherein the second semiconductor chip includes a layer made of a silicon substrate.

6. The semiconductor device according to claim 1, wherein the second semiconductor chip includes a surface made of a material including the polyimide.

7. The semiconductor device according to claim 1, wherein the resin is made of a material including the polyimide.

8. The semiconductor device according to claim 1, wherein
the second semiconductor chip includes a flash memory, and
the first semiconductor chip includes a controller that controls the flash memory.

9. The semiconductor device according to claim 1, wherein the first adhesive layer includes a Die Attach Film.

10. The semiconductor device according to claim 1, further comprising a second bonding wire electrically connecting the first semiconductor chip to the board and embedded in the first adhesive layer.

11. The semiconductor device according to claim 1, wherein a material of the second adhesive layer is different from a material of the resin layer.

12. The semiconductor device according to claim 1, further comprising a second member embedded in the resin, wherein
the second semiconductor chip includes a plurality of third semiconductor chips mutually stacked,
the second member is positioned between two of the plurality of third semiconductor chips adjacent to each other, and includes a fifth surface to which one of the plurality of third semiconductor chips is attached, a sixth surface to which another one of the plurality of third semiconductor chips is attached, and a seventh surface positioned between the fifth surface and the sixth surface and made of a material including an organic material, and
the resin adheres further to the seventh surface.

13. The semiconductor device according to claim 12, further comprising a plurality of second adhesive layers including the second adhesive layer positioned between the third surface and the eighth surface,
wherein each of the plurality of second adhesive layers attaches one of the plurality of third semiconductor chips to another one of the plurality of third semiconductor chips, the third surface, or the second member.

14. The semiconductor device according to claim 13, wherein the plurality of second adhesive layers include Die Attach Films.

* * * * *